(12) United States Patent
Arase (10) Patent No.: US 8,187,667 B2
(45) Date of Patent: May 29, 2012

(54) METHOD FOR DISPOSING A COMPONENT

(75) Inventor: Hidekazu Arase, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/149,252

(22) Filed: May 31, 2011

(65) Prior Publication Data

US 2011/0229642 A1 Sep. 22, 2011

Related U.S. Application Data

(63) Continuation of application No. PCT/JP2011/001482, filed on Mar. 14, 2011.

(30) Foreign Application Priority Data

Mar. 18, 2010 (JP) ................. 2010-062321

(51) Int. Cl.
*B05D 5/12* (2006.01)
*H05K 3/20* (2006.01)
*H05K 3/30* (2006.01)

(52) U.S. Cl. ................. 427/58; 29/831; 29/832; 29/834

(58) Field of Classification Search .................. None
See application file for complete search history.

(56) References Cited

U.S. PATENT DOCUMENTS

| 7,501,156 | B2 | 3/2009 | Nakabayashi et al. | |
|---|---|---|---|---|
| 7,709,291 | B2 | 5/2010 | Nakagawa | |
| 7,730,610 | B2 | 6/2010 | Nakagawa et al. | |
| 2009/0265929 | A1* | 10/2009 | Nakagawa et al. | 29/846 |

FOREIGN PATENT DOCUMENTS

| JP | 2004-095896 | 3/2004 |
|---|---|---|
| JP | 4149507 | 7/2008 |
| WO | WO 2007/037381 A1 | 4/2007 |
| WO | WO 2007037381 A1 * | 4/2007 |
| WO | WO 2009/122660 A1 | 10/2009 |

OTHER PUBLICATIONS

Deposition of Ionic Liquid Thin Films Onto Self-Assembled Monolayers, A. Cione, Thesis for Master of Science, May 2007, found at http://etd.library.vanderbilt.edu/available/etd-04022007-160025/unrestricted/Cione.pdf.*

* cited by examiner

*Primary Examiner* — Michael Cleveland
*Assistant Examiner* — James M Mellott
(74) *Attorney, Agent, or Firm* — McDermott Will & Emery LLP

(57) ABSTRACT

A method for disposing a component comprises: a step of preparing a substrate and a first liquid; a step of preparing a component-containing liquid containing the components and a second liquid; a step of disposing the first liquid in a hydrophilic region; a step of bringing the component-containing liquid into contact with the first liquid disposed on the hydrophilic region; a step of removing the first liquid and the second liquid to dispose the component on the hydrophilic region. The hydrophilic region is composed of a component-disposing region and a liquid-capturing region formed on the periphery of the component-disposing region. The liquid-capturing region comprises a surface represented by $X-(CH_2)_n S\text{-(substrate)}$ or $Y-(CH_2)_m-S\text{-(substrate)}$, where X represents $N^+R_3Q^-$ (Q represents Cl, Br, or I), OR, or halogen atom, R represents lower alkyl group, n represents a natural number of not less than 1 and not more than 3, Y represents COOH or OH, and m represents a natural number of not less than 1 and not more than 22.

6 Claims, 6 Drawing Sheets

METHOD FOR DISPOSING A COMPONENT

RELATED APPLICATIONS

This is a continuation of PCT International Application PCT/JP2011/001482 filed on Mar. 14, 2011, which claims priority to Japanese Patent Application No. 2010-062321 filed on Mar. 18, 2010. The disclosures of these applications including the specifications, the drawings, and the claims are hereby incorporated by reference in their entirety.

TECHNICAL FIELD

The present disclosure relates to a method for disposing a component.

BACKGROUND ART

Active-type liquid crystal display elements and organic electroluminescence display elements are formed on glass substrates. Pixels that are arranged in a matrix on the substrate are each controlled by a transistor placed in the vicinity of the pixel. With a current technology, however, crystalline semiconductor thin-film transistors cannot be formed on a glass substrate. Therefore, thin film transistors formed using amorphous silicon or polysilicon thin films are used for the control of pixels. Such thin film transistors have the advantage that they can be fabricated on a large-area substrate at low cost. The thin film transistors, however, have the disadvantage that their lower mobility than crystalline silicon prevents them from operating at high speed. To overcome this disadvantage, a large number of transistors are fabricated on a silicon wafer beforehand and then cut into individual pieces to be disposed on a substrate.

Figure 6A:
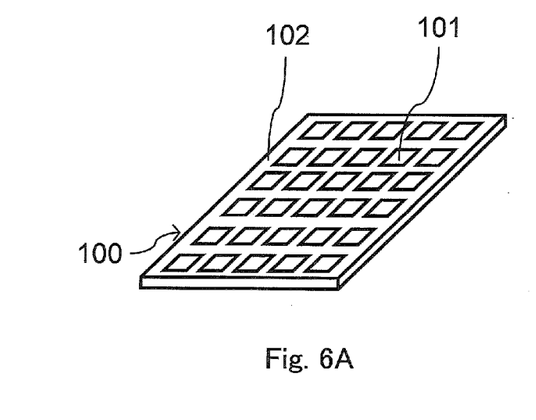
FIGS. 6A to 6D show the method of disposing components disclosed in the patent document 1.
Figure 6B:
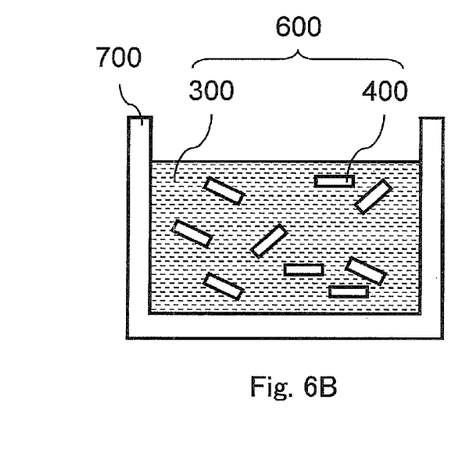

As shown in FIG. 6A, Patent Document 1 discloses a preparation of a substrate 100 comprising a plurality of hydrophilic regions 101 and a water-repellant region 102 which surrounds the respective hydrophilic regions 101. Next, as shown in FIG. 6B, the components 400 to be disposed on a substrate are dispersed in a solvent 300, which is substantially insoluble in water, to prepare component-containing liquid 600. One of the surfaces of the component 400 is hydrophilic and is to be bonded to the substrate 100, and the other surfaces of the component 400 are water-repellent.

Figure 6C:
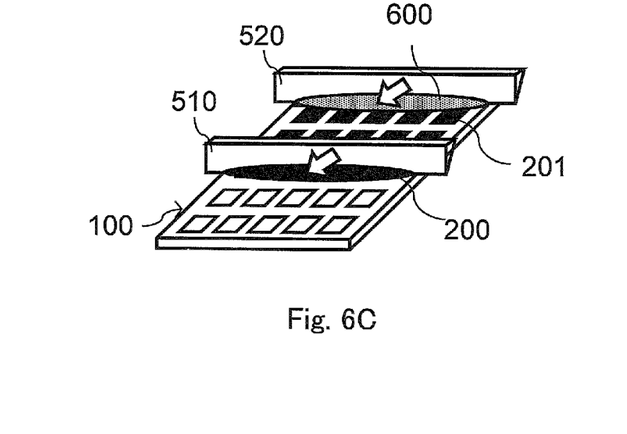
Figure 6D:
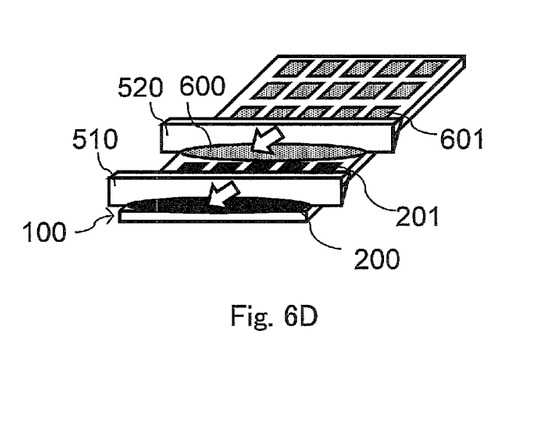

Next, as shown in FIG. 6C, water 200 is disposed in the plurality of hydrophilic regions 101 with a first squeegee 510. Subsequently, as shown in FIG. 6D, the component-containing liquid 600 is applied with a second squeegee 520 to bring the component-containing liquid 600 into contact with the water 201 disposed in the hydrophilic regions 101. During this process, the components 400 move into the water 201 disposed in the hydrophilic regions 101. Then, the water 201 and the solvent contained in the component-containing liquid 600 are removed so that the components 400 are fixed onto the hydrophilic regions 101.

CITATION LIST

Patent Literature

{PTL 1} U.S. Pat. No. 7,730,610, which corresponds to Japanese Patent No. 4149507.

SUMMARY OF INVENTION

Technical Problem

The method described in the patent document 1 is an excellent method of disposing the components 400 on the substrate 100. In this method, however, during a step of forming the hydrophilic regions 101, a slight photoresist can be remained on the hydrophilic regions 101. A hydrophobic material present in air can be attached on the hydrophilic regions 101. For these reasons, the amount of the water 201 disposed in the hydrophilic regions 101 can be decreased.

As a result, the component-containing liquid 600 is rapidly evaporated before it comes in contact with the water 201. This causes an efficiency of disposing the component 400 to be significantly lowered. When the area of the hydrophilic region 101 increases in order to increase the amount of the water 201 disposed in the hydrophilic region 101, a plurality of the components 400 can be disposed onto one hydrophilic region 101. Or, the component 400 can be disposed in a state where the component 400 is tilted in a planer view ("a distorted state").

The purpose of the disclosure is to provide a method for disposing a component accurately onto a predetermined position when the component is disposed on a substrate.

Solution to Problem

The present invention is a method of disposing a component on a substrate, the method comprising:

a step of preparing a substrate and a first liquid, wherein, the substrate comprises a water-repellent region and a hydrophilic region, the water-repellent region comprises a surface coated with a fluorine compound, the water-repellent region surrounds the hydrophilic region, and the first liquid is hydrophilic, a step of preparing component-containing liquid containing the component and a second liquid, wherein, the second liquid is insoluble in the first liquid, and the component comprises a hydrophilic surface, a step of disposing the first liquid on the hydrophilic region, a step of bringing the component-containing liquid into contact with the first liquid disposed on the hydrophilic region, a step of removing the first liquid and the second liquid to dispose the component on the hydrophilic region, wherein, the hydrophilic region is composed of a component-disposing region and a liquid-capturing region, the component is disposed on the component-disposing region, the liquid-capturing region is formed on the periphery of the component-disposing region, and the liquid-capturing region comprises a surface represented by the following chemical formula I:

[Chem. 1]

Chemical formula I or

X represents $N^+R_3Q^-$ (Q represents Cl, Br, or I), OR, or halogen atom,

R represents lower alkyl group, n represents a natural number of not less than 1 and not more than 3, Y represents COOH or OH, and m represents a natural number of not less than 1 and not more than 22.

The term "dispose" in the present specification includes "mount". An example of the components in the present specification is an electric component.

The method of the present invention can improve significantly the efficiency of disposing the components without loss of accuracy in disposing the components, because of the liquid-capturing regions with the surface represented by the chemical formula I.

DESCRIPTION OF EMBODIMENTS

The embodiment of the present invention is described below with reference to the drawings. Hatching lines may be omitted to facilitate the comprehension of the present specification.

FIG. 1A to FIG. 1D are perspective views showing an example of a water-repellant region 120 and a plurality of hydrophilic regions 110. FIG. 2A to FIG. 2E are top views showing other examples of a water-repellant region 120 and a plurality of hydrophilic regions 110.

In the following description, the first liquid is water. First, prepared is a substrate 100 shown in FIGS. 1A to 1D and in FIGS. 2A to 2E. The substrate 100 comprises a hydrophilic region 110 and a water-repellant region 120. The water-repellant region 120 surrounds the hydrophilic region 110. Each of the hydrophilic regions 110 comprises a component-disposing region 111 and a liquid-capturing region 112. The liquid-capturing region 112 is formed on the periphery of the component-disposing region 111.

The wettability of the component-disposing region 111 and the liquid-capturing region 112 to water is higher than that of the water-repellant region 120. Particularly, the component-disposing region 111 and the liquid-capturing region 112 are hydrophilic. The water-repellant region 120 is water-repellant.

The liquid-capturing region 112 comprises the surface represented by the chemical formula I.

[Chem. 1]

or

Chemical formula I

X represents $N^+R_3Q^-$ (Q represents Cl, Br, or I), OR, or halogen atom,

R represents lower alkyl group, n represents a natural number of not less than 1 and not more than 3, Y represents COOH or OH, and m represents a natural number of not less than 1 and not more than 22.

Figure 3:
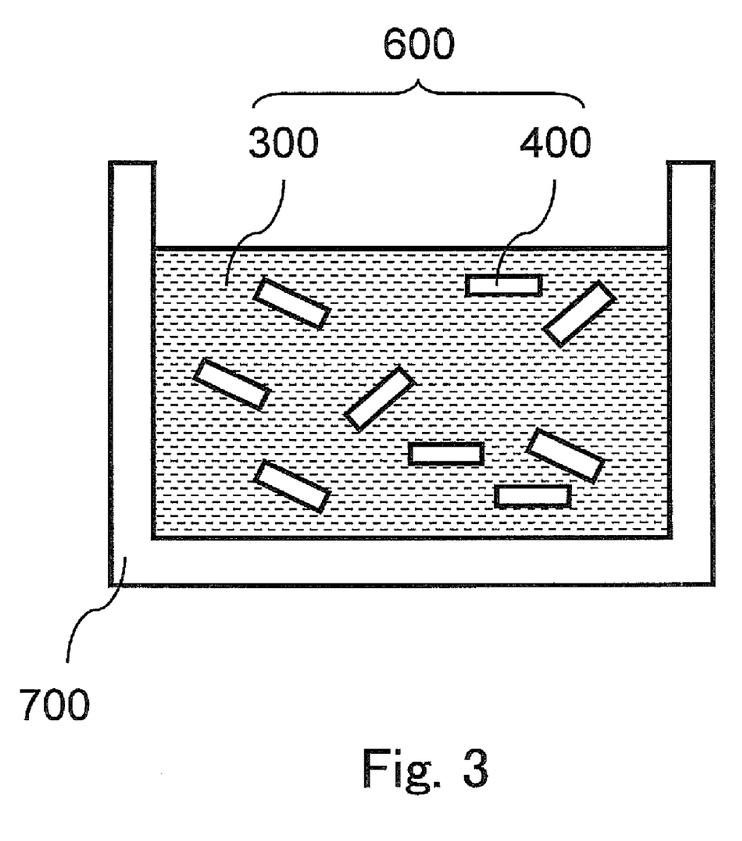
FIG. 3 is a cross-sectional view showing the component-containing liquid schematically in the disposing method of the present invention.

FIG. 3 schematically shows a component-containing liquid 600 poured into a vessel 700. The component-containing liquid 600 contains a second liquid 300 and components 400 dispersed in the second liquid 300. Water is substantially insoluble in the second liquid 300. An example of the second liquid 300 is hydrocarbon such as hexane. Specific other examples of the second liquid 300 are described later. The term "dispersion" in the present specification means a status where the components 400 do not aggregate in the second liquid 300. The component-containing liquid 600 may be stirred to disperse the components 400.

Figure 4A:
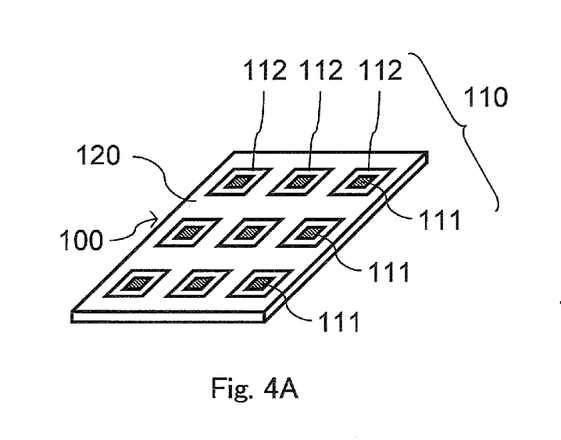
FIGS. 4A to 4D are perspective views showing the disposing method of the present invention.

FIG. 4A is a perspective view of the substrate 100 having the surface comprising the component-disposing regions 111, the liquid-capturing regions 112, and the water-repellant region 120.

Figure 4B:
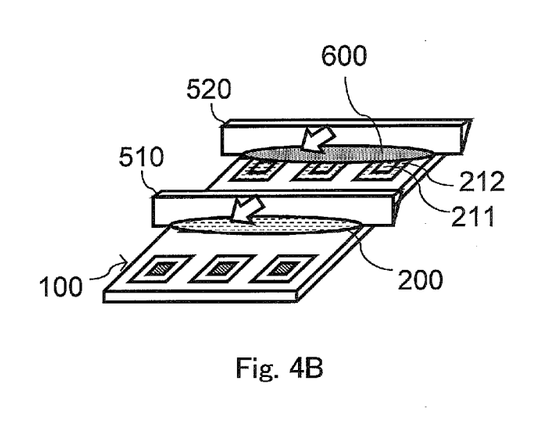

FIG. 4B schematically shows the device of disposing the components and the operation thereof. As shown in the FIG. 4B, the disposing device of the present invention comprises a first squeegee 510 and a second squeegee 520. The first squeegee 510 is used for subjecting the substrate 100 to water. The second squeegee 520 is used for subjecting the substrate 100 to the component-containing liquid 600. A predetermined distance is maintained between the first squeegee 510 and the second squeegee 520. While the predetermined distance is maintained, the first squeegee 510 and the second squeegee 520 move.

In the present embodiment, first, water is supplied onto the substrate 100 with the first squeegee 510. The component-disposing region 111 and the liquid-capturing region 112 are hydrophilic, and are surrounded by the water-repellant region 120. Accordingly, water is disposed onto both of the component-disposing region 111 and the liquid-capturing region 112. Water is not disposed onto the water-repellant region 120.

It is difficult for the water 211 disposed onto the component-disposing region 111 and the water 212 disposed onto the liquid-capturing region 112 to spread out of the component-disposing region 111 and the liquid-capturing region 112, respectively. The arrow in FIG. 4B indicates a scanning direction of the first squeegee 510 and the second squeegee 520. In the present embodiment, as shown in FIG. 4B, water is disposed onto the component-disposing region 111 and the liquid-capturing region 112 with the first squeegee 510. Instead of this, the substrate 100 may be immersed in water and drawn up.

In order to dispose water onto the component-disposing region 111 and the liquid-capturing region 112 more stably, it is preferable that the difference of the wettability to water is greater between the hydrophilic region 110 and the water-repellant region 120.

Figure 4C:
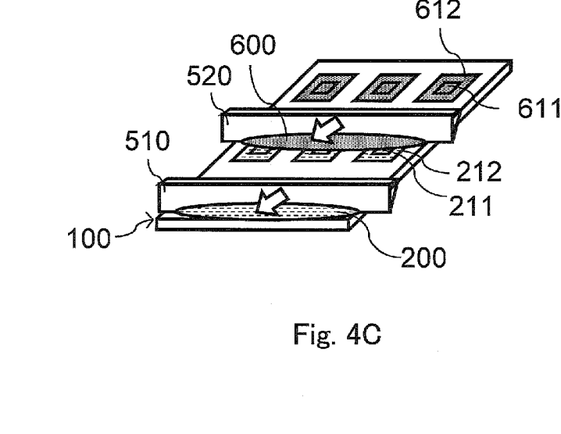

Next, as shown in FIG. 4C, the second squeegee 520 moves from the one side to the other side, namely from the back to the forward in FIG. 4C, to supply the component-containing liquid 600 onto the substrate 100. This causes the component-containing liquid 600 to come in contact with the water 211 and the water 212.

Because water is insoluble in the second liquid 300 substantially, the water 211 present on the component-disposing region 111 remains stably. The water 212 present on the liquid-capturing region 112 also remains stably. During this process, the components 400 move into the water 211 and the water 212 because of the interfacial tension applied to the components 400. Alternatively, the components 400 move to the interface formed by the second liquid 300 and the water 211 or to the interface formed by the second liquid 300 and the water 212.

Figure 4D:
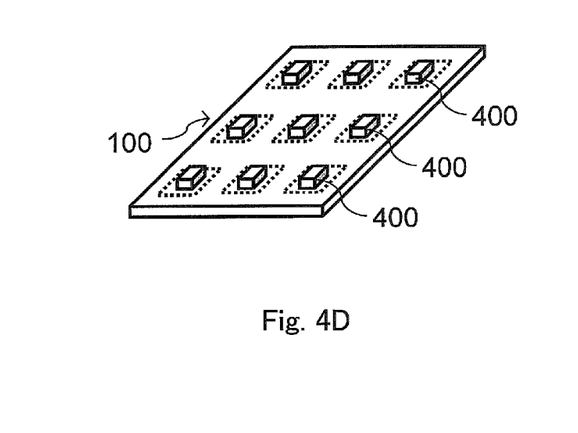

Next, the water 211, the water 212, and the second liquid 300 are removed from the surface of the substrate 100. During this process, as shown in FIG. 4D, the components 400 are disposed onto the component-disposing regions 111.

In the above-mentioned description, the first squeegee 510 and the second squeegee 520 move, while the substrate 100 does not move. Instead of this, neither the first squeegee 510 nor the second squeegee 520 may move, while the substrate 100 may move. Or, the all of the first squeegee 510, the second squeegee 520, and the substrate 100 may move. Hereinafter, these are collectively called "relative movement". Namely, the phrase "the squeegees move on the substrate relatively" includes the following three embodiments: (a) the first squeegee 510 and the second squeegee 520 move, while the substrate 100 does not move, (b) the neither the first squeegee 510 nor the second squeegee 520 moves, while the substrate 100 moves, and (c) all of the first squeegee 510, the second squeegee 520, and the substrate 100 move.

As mentioned above, the component-disposing region 111, the liquid-capturing region 112 comprising the surface represented by the chemical formula I, and the water-repellant region 120 are formed on the surface of the substrate 100, the water 211 and the water 212 are disposed accurately onto the component-disposing region 111 and the liquid-capturing region 112, respectively. As a result, the components 400 are disposed onto the substrate 100 efficiently and accurately. Namely, one component 400 is disposed onto one component-disposing region 111.

The liquid-capturing region 112 and the component-disposing region 111 are described below in more detail.

The disposing method of the present invention is characterized by that the hydrophilic region 110 comprises the component-disposing region 111 and the liquid-capturing region 112. As shown in FIG. 1A to FIG. 1D and FIG. 2A to FIG. 2E, one hydrophilic region 110 may comprise one or more liquid-capturing regions 112.

The shape of the liquid-capturing region 112 may be rectangular, triangular, trapezoidal, circular, ellipsoidal, or polygonal. FIG. 1A to FIG. 1D and FIG. 2A to 2E exemplify the shape of the liquid-capturing region 112. Two or more of the shapes shown in these drawings can be combined. When one hydrophilic region 110 comprises not less than two liquid-capturing regions 112, each of the liquid-capturing regions 112 may have different shapes. As shown in FIG. 1A, FIG. 1D, FIG. 2D, and FIG. 2E, the liquid-capturing region 112 wholly surrounds the component-disposing region 111. As shown in FIG. 1B, FIG. 1C, FIG. 2A, FIG. 2B, and FIG. 2C, the liquid-capturing region 112 is formed on the periphery of the portion of the component-disposing region 111.

When the area of one component-disposing region 111 is S2, and the sum of the areas of one or more liquid-capturing regions 112 formed on the periphery of the one component-disposing region 111 is S3, it is preferable that the value of S3/S2 is not less than 0.8 and not more than 3.5.

In the present embodiment, the liquid-capturing region 112 comprises the surface represented by the chemical formula I. The surface represented by the chemical formula I is described below.

In the present embodiment, a thiol compound is supplied to the surface of the substrate 100 to form the surface represented by the chemical formula I. It is preferable that the surface of the substrate 100 has a metal. An example of the thiol compound is 2-Mercapto-ethanol, 3-Hydroxy-propanethiol, HO—$CH_2(CH_2)_{21}$—SH, 11-Mercapto-undecane acid, 3-Mercapto-propione acid, 2-Chloro-ethanethiol, 2-Methoxy-ethanethiol, 2-Ethoxy-ethanethiol, and N,N,N-Trimethyl-2-mercapto-ethylammonium chloride. An example of the metal is a transition element such as gold, silver, copper, platinum, palladium and iron, or an alloy thereof.

Next, the component-disposing region 111 is described.

The shape of the component-disposing region 111 is determined according to the shape of the component 400 to be disposed on the component-disposing region 111. The shape of component-disposing region 111 includes, for example, a polygonal shape such as a triangle, a quadrangle, or a hexagon, or a circular or elliptical shape. The component-disposing region 111 preferably has the same shape as a predetermined surface of the component 400 to be disposed (the surface that faces the substrate when disposed on the substrate). The phrase "having the same shape" means that the shape of the predetermined surface of the component 400 to be disposed (that faces the substrate when disposed on the substrate) and the shape of the component-disposing region 111 are in a congruent or similar relationship in a mathematical sense.

S1 denotes the area of the predetermined surface of the component 400 to be disposed, namely, the area of the surface of the component 400 which faces the substrate when disposed on the substrate. The value of S2/S1 is preferably not less than 0.64 and not more than 1.44. When the value of S2/S1 is smaller than 0.64, the hydrophilic region 110 has a significantly small amount of water, which reduces the probability of disposing the component 400 therein. When the value of S2/S1 is greater than 1.44, the hydrophilic region 110 has significantly excess water. This causes a plurality of components 400 to be disposed in one component-disposing region 111.

The component-disposing region 111, the liquid-capturing region 112, and the water-repellant region 120 can be prepared by selectively forming a water-repellant film on a hydrophilic substrate by photolithography.

An example of one method of preparing the substrate 100 is described with reference to drawings.

Figure 5A:
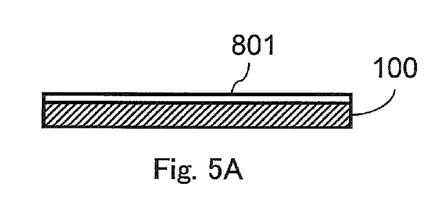
FIGS. 5A to 5G are cross-sectional views showing an example of the method of preparing the substrate in the disposing method of the present invention.
Figure 5B:
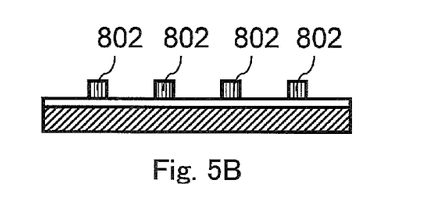
Figure 5C:
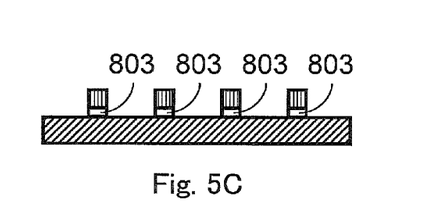
Figure 5D:
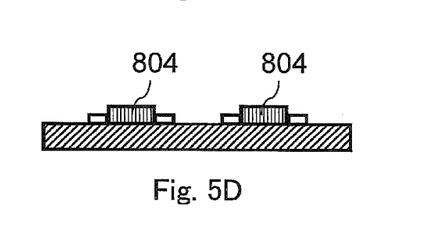

FIG. 5A to FIG. 5G show an example of preparing the substrate. First, as shown in FIG. 5A, a hydrophilic substrate 100 is prepared. A metal film 801 is formed on the substrate 100. Next, as shown in FIG. 5B, a protective film such as a positive resist film 802 is formed to cover the portion which is to be the liquid-capturing region 112. Next, as shown in FIG. 5C, a portion of the metal film 801 that is not covered by the positive resist film 802 is removed to form a metal film 803 is formed in the portion which is to be the liquid-capturing region 112. Next, as shown in FIG. 5D, the protective film 802 is removed. A positive resist film 804 is formed to cover the portion which is to be the component-disposing region 111.

Figure 5E:
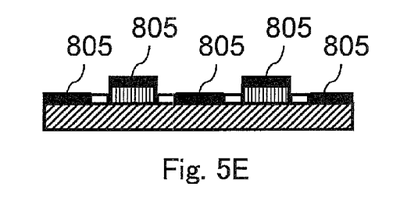

Next, as shown in FIG. 5E, a water-repellant film 805 is formed to cover the portion except for the metal film 803.

Figure 5F:
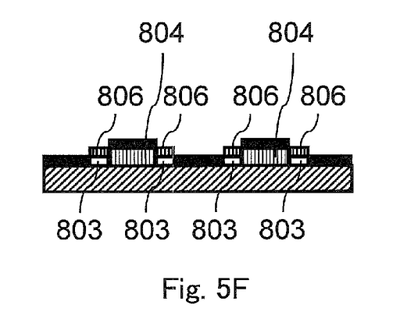

Next, as shown in FIG. 5F, the thiol compound such as 2-Mercapto-ethanol, 3-Hydroxy-propanethiol, HO—$CH_2(CH_2)_{21}$—SH, 11-Mercapto-undecane acid, 3-Mercaptopropione acid, 2-Chloro-ethanethiol, 2-Methoxy-ethanethiol, 2-Ethoxy-ethanethiol, and N,N,N-Trimethyl-2-mercapto-ethylammonium chloride is supplied on the metal film 803. During this process, the liquid-capturing region 112 is formed.

A method for forming the liquid-capturing region 112 is described in more detail. The substrate 100 is immersed into chloroform, alkane, alcohol, or silicone oil containing the thiol compound such as 2-Mercapto-ethanol, 3-Hydroxy-propanethiol, HO—$CH_2(CH_7)_{21}$—SH, 11-Mercapto-undecane acid, 3-Mercapto-propione acid, 2-Chloro-ethanethiol, 2-Methoxy-ethanethiol, 2-Ethoxy-ethanethiol, and N,N,N-Trimethyl-2-mercapto-ethylammonium chloride at a concentration of 2-3 vol %.

After immersed, the substrate 100 is washed with the solvent to form the liquid-capturing region 112 comprising the surface represented by the chemical formula I. The substrate 100 preferably has an active hydrogen on the surface thereof. An example of the material of the substrate 100 is silicon, silicon oxide, silicon nitride, stainless steel, copper, nickel and surface-activated resin. A typical example of the active hydrogen is hydrogen contained in a hydroxyl group (—OH).

Figure 5G:
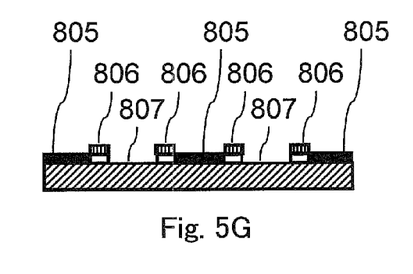

Finally, as shown in FIG. 5G, the positive resist film 804 is removed to form the component-disposing region 111, the liquid-capturing region 112, and the water-repellant region 120.

Next, the water-repellant region 120 is described.

The wettability of a solid surface with respect to water is related not only to the surface energy of the solid but also the surface tension of the water. The value of the surface energy of the solid, which is water repellent, is not particularly limited. However, it is preferable that the value is not less than 5 $mJ/m^2$ and less than 40 $mJ/m^2$. More preferably, the value is not less than 5 $mJ/m^2$ and not more than 25 $mJ/m^2$.

An organic film with lower wettability than those of the component-disposing region 111 and the liquid-capturing region 112 may be formed on the substrate to form the water-repellant region 120. "Wettability" is the wettability to water. An example of the organic film is a polymer film having fluoroalkyl chains, a film formed of a silane coupling agent or thiol molecules having fluoroalkyl chains, and an organic-inorganic hybrid film having fluoroalkyl chains formed by a sol-gel method.

Examples of the polymer film having fluoroalkyl chains are polytetrafluoroethylene, polydifluoroethylene, and derivatives thereof.

A method of forming the water-repellent film with a silane coupling agent is described below. The substrate may be immersed in chloroform, alkane, alcohol, or silicone oil containing a silane coupling agent having fluoroalkyl chains at a concentration of 2-3 vol %. Next, the substrate is washed with the solvent to form a monomolecular film. The silane coupling agent having fluoroalkyl chains is represented by a general formula $CF_3(CF_2)_n(CH_2)_mSiX_3$. Here, n is a natural number of not more than 10, m is a natural number of not more than 10, X is halogen (preferably Cl) or alkoxy group. Examples of the silane coupling agents are $CF_3(CF_2)_7 C_2H_4SiCl_3$ and $CF_3C_2H_4SiCl_3$. The substrate preferably has an active hydrogen on its surface. Examples of the material of the substrate are silicon, silicon oxide, silicon nitride, stainless steel, copper, nickel, and surface-activated resin.

The surface on which only a water-repellant film is selectively attached may be formed on the portion which is to be the water-repellant region 120. For example, the substrate on which gold (Au) has been formed in only the portion which is to be water-repellant region 120 is prepared, and then the substrate is immersed into the organic solution containing thiol. This causes only the portion where gold has been formed to be turned into the water-repellant region 120. Particularly, the substrate is immersed in ethanol solution or propanol solution containing thiol molecule having fluoroalkyl group at a concentration of 2-3 vol %. Subsequently, the substrate is washed with alcohol. Instead of gold, silver or copper may be employed.

A method for forming the water-repellant film by a sol-gel method is described below. An alcohol solution in which tetraethoxysilane, which is a precursor of silicon oxide, alkoxysilane having fluoroalkyl chains, acid catalyst, and water are dissolved is applied to the substrate by spin coating or dipping. Subsequently, the substrate is heated at or above 100 degrees Celsius. This water-repellent film can be formed on almost all kinds of substrates.

A water-repellent region 120 may be formed by methods such as ink jet printing, screen printing, relief printing, intaglio printing, and microcontact printing.

Finally, the water 211, the water 212, and the second liquid 300 are removed from the substrate 100. The components 400 are disposed in predetermined positions, irrespective of the order of removing of the water 211, the water 212, and the second liquid 300.

The water 211, the water 211, and the second liquid 300 are removed by a known method. A well-known drying method can be used. Natural drying, drying in a vacuum desiccator, drying by blowing air or gas, drying by heating and/or under reduced pressure can be used. The substrate 100 may be washed before drying.

The first liquid 200 and the second liquid 300 may be selected appropriately in consideration of the interfacial tension that acts on the interface between the first liquid 200 and the second liquid 300 and the respective degrees of wettability of the first liquid 200 and the second liquid 300 with respect to the surface of the component 400.

The first liquid 200 is required to be substantially insoluble in the second liquid 300. Because the first liquid 200 is substantially insoluble in the second liquid 300, the first liquid 200 stays stably in the component-disposing region 111 when the second liquid 300 comes in contact with the first liquid 200. And the resulting interfacial tension allows the component 400 to move into the first liquid 200. The phrase "substantially insoluble" means that the solubility defined by the weight of the first liquid dissolved in 100 ml of the second liquid is 10 gram or less, and more preferably 1 gram or less.

A combination of the first liquid 200 and the second liquid 300 is, for example, a combination of a liquid with high polarity as the first liquid 200 and a liquid with lower polarity than that of the first liquid 200 as the second liquid 300. Namely, the first liquid 200 is hydrophilic, and the second liquid 300 is hydrophobic.

An example of the first liquid 200 is water. Instead of water, alcohols such as methanol, ethanol, ethylene glycol, and glycerol, and a mixture of such an alcohol and water can be used. Water is more suitable because it has a high surface tension and therefore enables the component 400 to be held firmly in the component-disposing region 110.

Examples of the second liquid 300 are alkanes such as hexane, heptane, octane, nonane, decane, undecane, dodecane, tridecane, tetradecane, pentadecane, and hexadecane;

aromatic hydrocarbons such as toluene, benzene, and xylene;

chlorinated solvents such as chloromethane, dichloromethane, chloroform, carbon tetrachloride, monochlorobutane, dichlorobutane, monochloropentane, and dichloropentane;

ethers such as diethyl ether, and petroleum ether;
esters such as ethyl acetate, and butyl acetate;
silicone oil;
perfluorooctane;
perfluorononane; and
mixtures of these.

It is preferable that the second liquid 300 is a chlorinated solvent.

The material of the substrate 100 is not limited. A substrate formed of an inorganic material, a polymeric resin material, or a composite of an inorganic material and a polymeric resin material may be used. The inorganic material includes ceramics such as alumina, silicon, and glass. The polymeric resin material includes polyimide resin, polyamide resin, epoxy resin, and polycarbonate resin. The composite of an inorganic material and a polymeric resin material is, for example, a composite material containing fibers made of glass, ceramic or metal, and a polymeric resin material. An SOI (Silicon On Insulator) substrate or a compound semiconductor substrate may also be used.

The component 400 and the component-containing liquid 600 can be prepared by a known method. Patent Literature 1 discloses such a known method.

When a high-polarity liquid such as water is used as the first liquid 200, it is preferable that the component 400 has a higher surface energy. Particularly, the surface energy is 40 $mJ/m^2$ or more.

When the surface energy of the component 400 is low, it is preferable to treat the surface of the component 400 to increase its surface energy. When the component 400 has silicon on its surface, the surface may be irradiated with ultraviolet light in an ozone atmosphere to increase the surface energy.

A thin film having an affinity for the first liquid 200 may be formed on the surface of the component 400 to increase the surface energy of the component 400. When the first liquid 200 is water, an example of the thin film is a hydrophilic film. For example, a hydrophilic film of silicon oxide, silicon nitride, or titanium oxide may be formed on the surface of the component 400 by a vacuum sputtering method or a thermal CVD method. After the formation of the hydrophilic film, the surface of the component 400 can be irradiated with ultraviolet light in an ozone atmosphere. The surface of the component 400 can be modified with a silane coupling agent having an amino group, a carboxyl group, or a hydroxyl group at the terminal position to increase the surface energy of the component 400. When the surface of the component 400 has a metal, the surface can be modified with a thiol having an amino group, a carboxyl group, or a hydroxyl group at the terminal position.

The component-disposing region 111, the liquid-capturing region 112 represented by the chemical formula I, and the water-repellant region 120 are formed on the surface of the substrate 100 to dispose water in the component-disposing region 111 and the liquid-capturing region 112 accurately. As a result, the component 400 can be disposed on the substrate 100 with high efficiency and high accuracy.

EXAMPLES

The following examples describe the disposing method of the present invention in more detail.

Example 1

Preparation of the Substrate onto which the Components are Disposed

First, by the method shown in FIGS. 5A to 5G, the hydrophilic regions 110 surrounded by the water-repellant region 120 were formed on the silicon substrate. In the present example, the component-disposing region 111 had a size of 20 micrometers×40 micrometers. The liquid-capturing region 112, which is formed in the periphery thereof, had a width of 10 micrometers. In the present example, two regions were formed on the substrate 110 in order to measure static contact angles with regard to pure water in the component-disposing region 111 and the liquid-capturing region 112. The shape of each of the two regions was a square with 1 cm×1 cm.

The surface of a 4 inch silicon substrate with a thickness of 525 micrometers was oxidized by plasma treatment in an atmosphere containing oxygen to provide hydrophilic property to the surface. Subsequently, a nickel film with a thickness of 50 nm was formed by an electron beam evaporation deposition technique. Furthermore, a gold film with a thickness of 150 nm was formed on the nickel film.

Figure 1A:
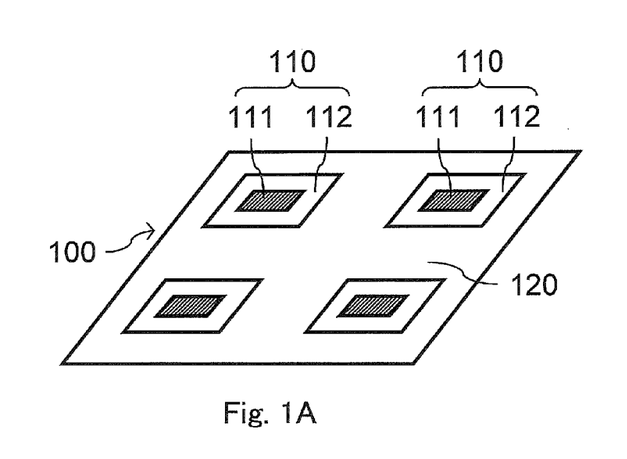
FIGS. 1A to 1D are perspective views showing the hydrophilic region and the water-repellant region in the disposing method of the present invention.
Figure 1B:
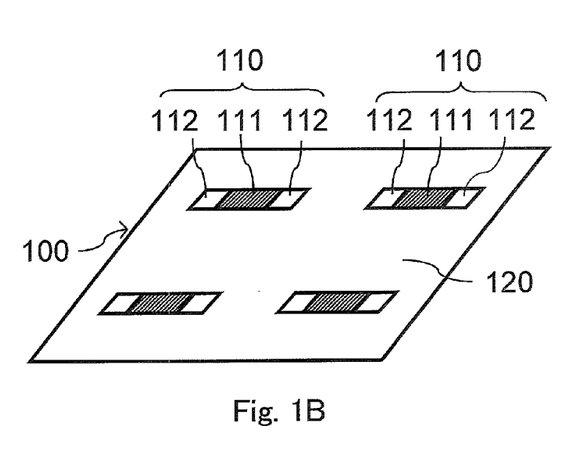
Figure 1C:
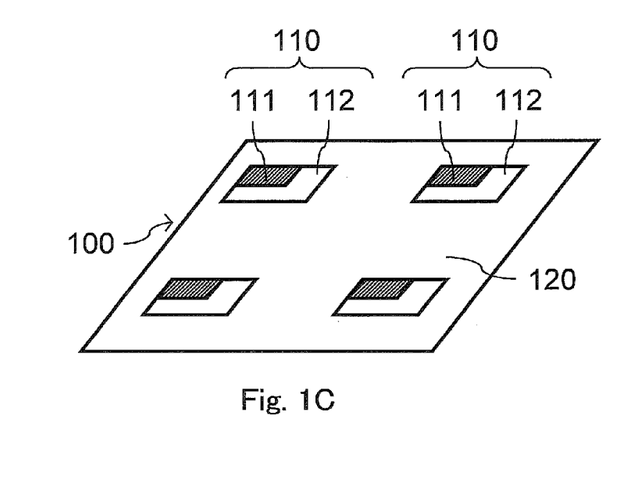
Figure 1D:
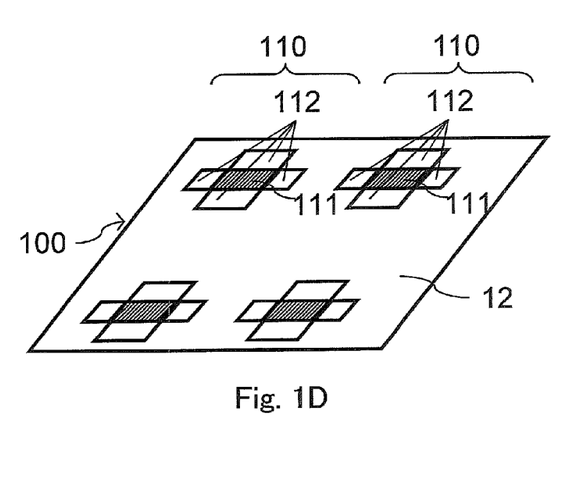
Figures 2A, 2B, 2C, 2D, 2E:
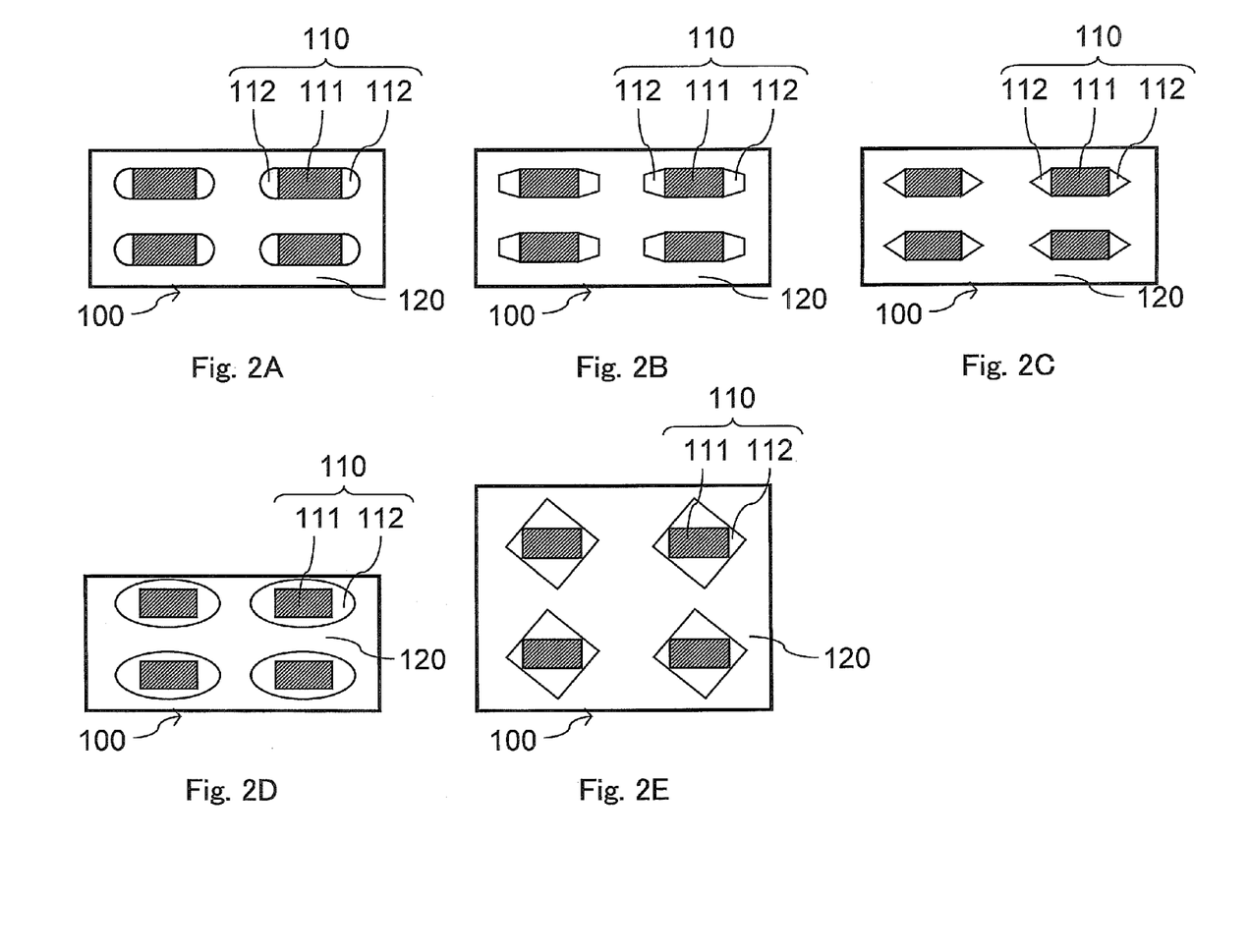
FIGS. 2A to 2E are top views showing the hydrophilic region and the water-repellant region in the disposing method of the present invention.

Subsequently, with use of a photolithography, a positive resist pattern with a width of 10 micrometers was formed in the whole periphery of a rectangle with 20 micrometers×40 micrometers (See FIG. 1A). Next, the substrate was immersed in the gold etchant and in the nickel etchant in this order to remove the gold film and the nickel film at the portion which the resist did not cover. Subsequently, the substrate was subjected to the oxygen plasma atmosphere in a vacuum to remove the resist so as to form a plurality of the metal patterns. Next, a rectangular positive resist pattern with 20 micrometers×40 micrometers was formed with photolithography.

In a dry atmosphere, the substrate was immersed for twenty minutes in a perfluorooctane solution containing $CF_3(CF_2)_7 C_2H_4SiCl_3$ at a concentration of 1 vol % (hereinafter, "FS-17"). Subsequently, the substrate was washed in pure perfluorooctane to remove the solvent. Furthermore, the resist film was removed with acetone.

Next, the substrate was immersed for twenty-four hours in an ethanol solution containing 2-mercaptoethanol at a concentration of 10 mM. Subsequently, the substrate was washed with ethanol to remove the solvent. Thus, the liquid-capturing region 112 (region 806 in FIG. 5F) was formed on the substrate.

Furthermore, the resist was removed with use of N-methyl-pyrrolidone, acetone, and isopropyl alcohol in this order. Thus, the component-disposing region 111 (region 807 in FIG. 5G) was formed on the substrate.

Thus, the hydrophilic region 110 surrounded by the water-repellant region 120 was formed on the substrate 100.

The static contact angles with regard to water were measured with the two square regions with 1 cm×1 cm each. The static contact angle of the component-disposing region 111 was 15 degrees. The static contact angle of the liquid-capturing region 112 was 60 degrees. The static contact angle of the water-repellant region 120 was 107 degrees.

<Components-Containing Liquid>

The component-containing liquid 600 containing the components 400 consisting of silicon oxide was prepared in accordance with the following process.

First, an aluminum film with a thickness of 100 nm was formed on a silicon substrate with a thickness of 525 micrometers by an electron beam evaporation deposition technique. Subsequently, a silicon oxide film with a thickness of 200 nm was formed by plasma CVD.

Rectangular resist patterns of 20 micrometers×40 micrometers were formed on the resulting substrate by photolithography. A part of the silicon oxide was removed by dry etching using the resist patterns as masks. Then, the remaining resist films were removed by plasma ashing treatment to form silicon oxide patterns (hereinafter referred to as silicon oxide plates) of 20 micrometers long×40 micrometers wide× 0.2 micrometers high. Subsequently, the aluminum thin film was etched in a 50 degrees Celsius mixture of phosphoric acid and nitric acid (hereinafter referred to as hot phosphoric acid) to lift-off the silicon oxide plates.

Next, the silicon oxide plates dispersed in the hot phosphoric acid were subjected to suction filtration through a filter. The filter to which the silicon oxide plates adhered was dried overnight in a dry atmosphere. Then the filter was immersed for two hours in a 1,4-dichlorobutane solution containing 1-chloroethyl-trichlorosilane at a concentration of 1 vol %. Suction filtration was carried out in a dry nitrogen atmosphere, and unreacted 1-chloroethyl-trichlorosilane was removed by washing. Thus, silicon oxide plates with chemically-modified surfaces were obtained on the filter. This filter was immersed in the 1,4-dichlorobutane and an ultrasonic wave was applied to disperse the silicon oxide plates that had adhered to the filter in 1,4-dichlorobutane. Thus, the component-containing liquid was obtained.

The first squeegee 510 for disposing water onto the substrate 100 was made of stainless steel. The forefront of the first squeegee 510 had a slit with 20 micrometers long and 0.5 micrometer wide. In order to hold water stably, the slit had an absorbent cotton inside.

The second squeegee 520 for disposing the component-containing liquid 600 was made of polyethylene, and had a shape of a knife.

<Disposing Method>

The first squeegee 510 and the second squeegee 520 were disposed along one end of the substrate 100 in such a manner that the edge surfaces of these squeegees were orthogonal to the longitudinal direction of the substrate 100. The distances between the edge surfaces of these squeegees and the substrate 100 are set to be approximately 0.2 micrometers. The distance between the first squeegee 510 and the second squeegee 520 was set to be 1 mm.

Next, approximately fifty microliters of the silicon oxide plates dispersion liquid were disposed between the second squeegee 520 and the substrate 100 with a glass pipette. Subsequently, the first squeegee 510 and the second squeegee 520 were moved at a rate of 10 mm/second. This process was repeated ten times.

Example 2

A similar experiment to that of the example 1 was performed except that $CF_3C_2H_4SiCl_3$ (hereinafter refereed to as "FS-3") was employed to form the water-repellant region 120. The static contact angle of the component-disposing region 111 was 16 degrees. The static contact angle of the liquid-capturing region 112 was 26 degrees. The static contact angle of the water-repellant region 120 was 104 degrees.

Example 3

A similar experiment to that of the example 1 was performed except that an ethanol solution containing 3-hydroxy-propanethiol was used instead of the ethanol solution containing 2-mercaptoethanol. The static contact angle of the component-disposing region 111 was 15 degrees. The static contact angle of the liquid-capturing region 112 was 42 degrees.

Example 4

A similar experiment to that of the example 1 was performed except that an ethanol solution containing $HO-CH_2(CH_2)_{21}-SH$ was used instead of the ethanol solution containing 2-mercaptoethanol. The static contact angle of the component-disposing region 111 was 14 degrees. The static contact angle of the liquid-capturing region 112 was 35 degrees.

Example 5

A similar experiment to that of the example 1 was performed except that an ethanol solution containing 11-mercapto-undecanoic acid was used instead of the ethanol solution containing 2-mercaptoethanol. The static contact angle of the component-disposing region 111 was 14 degrees. The static contact angle of the liquid-capturing region 112 was 38 degrees.

Example 6

A similar experiment to that of the example 1 was performed except that $CF_3C_2H_4SiCl_1$ (hereinafter, "FS-3") was used instead of the FS-17. The static contact angle of the component-disposing region 111 was 14 degrees. The static contact angle of the water-repellant region 120 was 103 degrees.

Example 7

A similar experiment to that of the example 1 was performed except that an ethanol solution containing 3-mercapto-propionic acid was used instead of the ethanol solution containing 2-mercaptoethanol. The static contact angle of the component-disposing region 111 was 15 degrees. The static contact angle of the liquid-capturing region 112 was 31 degrees.

Example 8

A similar experiment to that of the example 1 was performed except that an ethanol solution containing 2-chloro-ethanethiol was used instead of the ethanol solution containing 2-mercaptoethanol. The static contact angle of the component-disposing region 111 was 16 degrees. The static contact angle of the liquid-capturing region 112 was 53 degrees.

Example 9

A similar experiment to that of the example 1 was performed except that an ethanol solution containing 2-methoxy-ethanethiol was used instead of the ethanol solution containing 2-mercaptoethanol. The static contact angle of the component-disposing region 111 was 14 degrees. The static contact angle of the liquid-capturing region 112 was 48 degrees.

Example 10

A similar experiment to that of the example 1 was performed except that an ethanol solution containing N,N,N-trimethyl-2-mercapto-ethylammonium chloride was used instead of the ethanol solution containing 2-mercaptoethanol. The static contact angle of the component-disposing region 111 was 16 degrees. The static contact angle of the liquid-capturing region 112 was 33 degrees.

Comparative Example 1

A similar experiment to the example 1 was performed without forming the liquid-capturing region 112. Namely, in the comparative example 1, the resist patters for forming the liquid-capturing region 112 were not formed, and the treatment with 2-mercaptomethanol was not performed. Only the component-disposing region 111 and water-repellant region 120 were formed. The static contact angle of the component-disposing region 111 was 15 degrees.

Comparative Example 2

In the comparative example 2, a similar experiment to the example 1 was performed except that the treatment with 2-mercaptomethanol was not performed. Namely, the component-disposing region 111 was expanded. The static contact angle of the component-disposing region 111 was 13 degrees. The static contact angle of the liquid-capturing region 112 was 68 degrees.

Table 1 shows the surface treatment reagents and the static contact angles with regard to water of the respective regions in the examples 1-10 and the comparative examples 1-2.

than 0.2, and "Poor" if the value of Nc/Np was not less than 0.2. The larger the value of Nc/Np is, the lower the accuracy is.

Table 2 shows the values of Np and Nc/Np in the examples 1-10 and the comparative examples 1-2.

TABLE 2

| | The number of hydrophilic regions | Np | Nc | Nc/Np | Accuracy Evaluation |
|---|---|---|---|---|---|
| Example 1 | 36 | 24 | 3 | 0.13 | Good |
| Example 2 | 36 | 23 | 2 | 0.09 | Excellent |
| Example 3 | 36 | 19 | 1 | 0.05 | Excellent |
| Example 4 | 36 | 20 | 2 | 0.10 | Good |
| Example 5 | 36 | 18 | 2 | 0.11 | Good |
| Example 6 | 36 | 20 | 3 | 0.15 | Good |
| Example 7 | 36 | 21 | 4 | 0.19 | Good |
| Example 8 | 36 | 18 | 2 | 0.11 | Good |
| Example 9 | 36 | 19 | 3 | 0.16 | Good |
| Example 10 | 36 | 17 | 3 | 0.18 | Good |
| Comparative Example 1 | 36 | 9 | 2 | 0.22 | Poor |
| Comparative Example 2 | 36 | 13 | 7 | 0.54 | Poor |

TABLE 1

| | Hydrophilic Region | | | | | |
|---|---|---|---|---|---|---|
| | Liquid-capturing Region | | Component-disposing Region | | Water-repellant Region | |
| | Surface treatment reagent | Contact Angle | Surface treatment reagent | Contact Angle | Surface treatment reagent | Contact Angle |
| Example 1 | 2-Mercapto-ethanol | 27 degrees | Not Treated | 15 degrees | FS-17 | 107 degrees |
| Example 2 | 2-Mercapto-ethanol | 26 degrees | Not Treated | 16 degrees | FS-3 | 104 degrees |
| Example 3 | 3-Hydroxy-propanethiol | 42 degrees | Not Treated | 15 degrees | FS-17 | 108 degrees |
| Example 4 | HO—$CH_2(CH_2)_{21}$—SH | 35 degrees | Not Treated | 14 degrees | FS-17 | 109 degrees |
| Example 5 | 11-Mercapto-undecane acid | 38 degrees | Not Treated | 14 degrees | FS-17 | 108 degrees |
| Example 6 | 11-Mercapto-undecane acid | 37 degrees | Not Treated | 14 degrees | FS-3 | 103 degrees |
| Example 7 | 3-Mercapto-propione acid | 31 degrees | Not Treated | 15 degrees | FS-17 | 108 degrees |
| Example 8 | 2-Chloro-ethanthiol | 53 degrees | Not Treated | 16 degrees | FS-17 | 108 degrees |
| Example 9 | 2-Methoxy-ethanthiol | 48 degrees | Not Treated | 14 degrees | FS-17 | 109 degrees |
| Example 10 | N,N,N-Trimethyl-2-mercapto-ethylammonium chloride | 33 degrees | Not Treated | 16 degrees | FS-17 | 108 degrees |
| Comparative Example 1 | Not Formed | — | Not Treated | 15 degrees | FS-17 | 108 degrees |
| Comparative Example 2 | Not Treated | 68 degrees | Not Treated | 13 degrees | FS-17 | 108 degrees |

The present inventors observed a status of disposition of the silicon oxide plates onto the substrate 100 by a microscope to evaluate the examples 1-10 and the comparative examples 1-2.

Particularly, thirty-six hydrophilic regions were selected. Out of the selected thirty-six hydrophilic regions, the number (Np) of the hydrophilic regions where one silicon oxide plate was disposed accurately was counted. Furthermore, the number (N1) of the hydrophilic regions where a plurality of plates were disposed was counted. The number (N2) of the hydrophilic regions where one silicon oxide plate was disposed in the distorted state was also counted. Nc denotes the sum of N1 and N2.

It was decided that the disposing status was "Excellent" if the value of Nc/Np was zero or more and less than 0.1, "Good" if the value of Nc/Np was not less than 0.1 and less As shown in Table 2, the values of Np in the examples 1-10 were not less than 17 and not more than 24. The values of Nc/Np in the examples 1-10 were less than 0.2.

On the contrary, the values of Np in the comparative examples 1 and the comparative example 2 were 9 and 13, respectively. Furthermore, the value of Nc/Np in the comparative example 2 was 0.84, which was much lower than these of the examples 1-10.

From the above-mentioned results, it is understood that the method of the present invention achieves a great improvement of the efficiency of disposing the components without loss of the accuracy of disposing the components.

INDUSTRIAL APPLICABILITY

The present method of disposing the components is utilized for disposing the components including electric ele- ments and pillar-shaped microcomponents. The present method of disposing the components is utilized for fabricating an electric device and an electric component. For example, the method of the present invention is used for fabricating a circuit board and an electric device including the same, and for repairing the circuit board and the electric device including the same.

The invention claimed is:

1. A method of disposing a component on a substrate, the method comprising:
    a step of preparing a substrate and a first liquid, wherein,
        the substrate comprises a water-repellent region and a hydrophilic region,
        the water-repellent region comprises a surface coated with a fluorine compound,
        the water-repellent region surrounds the hydrophilic region, and
        the first liquid is hydrophilic,
    a step of preparing component-containing liquid containing the component and a second liquid, wherein,
        the second liquid is insoluble in the first liquid, and
        the component comprises a hydrophilic surface,
    a step of disposing the first liquid on the hydrophilic region,
    a step of bringing the component-containing liquid into contact with the first liquid disposed on the hydrophilic region,
    a step of removing the first liquid and the second liquid to dispose the component on the hydrophilic region, wherein,
        the hydrophilic region is composed of a component-disposing region and a liquid-capturing region,
        the component is disposed on the component-disposing region,
        the liquid-capturing region is formed on the periphery of the component-disposing region,
        the liquid-capturing region comprises a surface represented by the following chemical formula I:

Chemical formula I where X represents $N^+R_3Q^-$ (Q represents Cl, Br, or I), OR, or halogen atom,
R represents lower alkyl group,
n represents a natural number of not less than 1 and not more than 3,
Y represents COOH or OH, and
m represents a natural number of not less than 1 and not more than 22, and
a contact angle of the liquid-capturing region is greater than that of the component-disposing region, and
the contact angle of the liquid-capturing region is less than that of the water-repellant region.

2. The method according to claim 1, wherein the liquid-capturing region is formed on a part of the periphery of the component-disposing region.

3. The method according to claim 1, wherein the liquid-capturing region is formed on all the periphery of the component-disposing region.

4. The method according to claim 1, wherein the first liquid is water, and the second liquid is a chlorinated solvent.

5. The method according to claim 1, wherein the second liquid has less polarity than the first liquid.

6. The method according to claim 1, further comprising a step of causing the surface of the component to be hydrophilic before the step of disposing the first liquid.

* * * * *